US009576667B2

(12) United States Patent
Goda et al.

(10) Patent No.: US 9,576,667 B2
(45) Date of Patent: Feb. 21, 2017

(54) APPARATUSES AND METHODS FOR NON-VOLATILE MEMORY PROGRAMMING SCHEMES

(71) Applicant: MICRON TECHNOLOGY, INC., Boise, ID (US)

(72) Inventors: Akira Goda, Boise, ID (US); William C Filipiak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/538,477

(22) Filed: Nov. 11, 2014

(65) Prior Publication Data

US 2016/0133326 A1    May 12, 2016

(51) Int. Cl.
G11C 16/34 (2006.01)
G11C 16/10 (2006.01)
G11C 16/26 (2006.01)

(52) U.S. Cl.
CPC ........... *G11C 16/10* (2013.01); *G11C 16/3427* (2013.01); *G11C 16/26* (2013.01); *G11C 2216/16* (2013.01)

(58) Field of Classification Search
CPC ..... G11C 16/04; G11C 16/10; G11C 16/3427; G11C 2216/16; G11C 16/26
See application file for complete search history.

(56) References Cited

U.S. PATENT DOCUMENTS

| 8,670,285 | B2 | 3/2014 | Dong et al. | |
|---|---|---|---|---|
| 8,848,450 | B2* | 9/2014 | Kang | G11C 11/5628 365/185.22 |
| 2006/0044872 | A1 | 3/2006 | Nazarian | |
| 2008/0031041 | A1* | 2/2008 | Han | G11C 11/5628 365/185.03 |
| 2009/0059668 | A1* | 3/2009 | Chang | G11C 16/3418 365/185.16 |
| 2013/0044542 | A1* | 2/2013 | Huang | G11C 16/10 365/185.03 |
| 2014/0036590 | A1 | 2/2014 | Feeley et al. | |
| 2014/0071758 | A1 | 3/2014 | Maejima | |
| 2014/0169098 | A1 | 6/2014 | Tanzawa et al. | |
| 2015/0036430 | A1* | 2/2015 | Sukegawa | G11C 16/10 365/185.11 |

* cited by examiner

*Primary Examiner* — Khamdan Alrobaie
(74) *Attorney, Agent, or Firm* — Dorsey & Whitney LLP

(57) ABSTRACT

Apparatuses and methods for a non-volatile memory scheme are described herein. An example apparatus may include a memory block including a plurality of subblocks of memory cells and further may include a control unit. The control unit may be configured to program a first access line group of each subblock of the plurality of subblocks during a program operation and to program a second access line group of each subblock of the plurality of subblocks during the program operation responsive to programming the first access line group of each of the plurality of subblocks.

18 Claims, 7 Drawing Sheets

APPARATUSES AND METHODS FOR NON-VOLATILE MEMORY PROGRAMMING SCHEMES

BACKGROUND

Memory cell density, such as that of non-volatile memory, has been improved significantly in an effort to achieve greater storage capacity, while not significantly increasing cost or memory footprint. One widely adopted solution has been to implement memory cells in three-dimensions, for instance, using vertically oriented NAND strings.

Implementing memories in this manner has presented challenges, however. For example, as a result of three-dimensional implementation, implementing buffers used in program operations with sufficient capacity has proven problematic.

DETAILED DESCRIPTION

Apparatuses and methods for non-volatile memory programming schemes are described herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
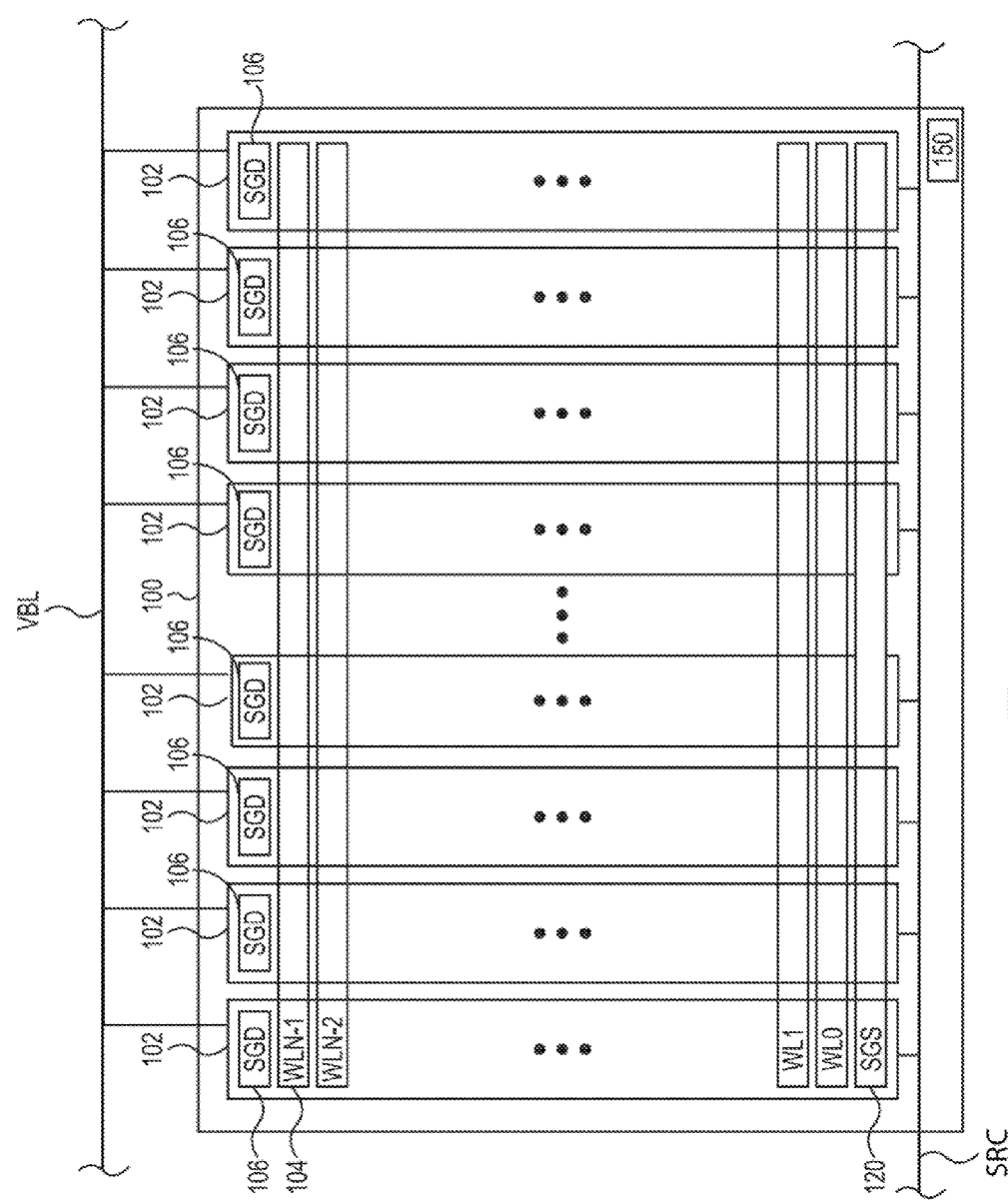
FIG. 1 is a block diagram of an apparatus according to an embodiment of the present invention.

FIG. 1 is a block diagram of an apparatus that includes a memory block 100 according to an embodiment of the present invention. As used herein, apparatus may refer to, for example, an integrated circuit, a memory device, a memory system, an electronic device or system, a smart phone, a tablet, a computer, a server, etc. The memory block 100 includes a plurality of memory subblocks 102, a plurality of memory access lines 104, a plurality of select gate drain (SGD) control lines 106, a select gate source (SGS) control line 120, and control unit 150. Each of the SGD control lines 106 may be associated with a respective memory subblock 102 and the SGS control line 120 may be associated each memory subblock 102.

Each of the memory subblocks 102 may include a plurality of memory cells, such as non-volatile memory cells (e.g., NAND memory cells) that may be arranged in rows and/or columns. In some examples, each of the memory cells may be a single-level cell (SLC) and/or may be a multi-level cell (MLC). In this manner, each memory cell may be programmed to distinct voltage states, each of which may correspond to a particular representation of binary data (e.g., single bit data 0, 1, multi-bit data 00, 01, 10, 11, multi-bit data 000, 001, 010, 011, 100, 101, 110, 111). NAND memory cells of the memory block 100 may be implemented using one or more NAND strings within each memory subblock 102. A string may, for instance, include 32 non-volatile memory cells, or may include a greater or lesser number of memory cells, and memory cells of the string may share a common channel. A memory subblock 102 may include any number of strings.

In some examples, a string may include a select gate drain (SGD) switch (not shown in FIG. 1) located at a first end of the string and a select gate source (SGS) switch (not shown in FIG. 1) located at a second end of the string opposite the first end. The SGD switch and the SGS switch may be implemented as transistors. Memory cells of the string may be coupled in a series configuration between the SGD switch and the SGS switch. Each of the memory cells of the string may be coupled to a respective memory access line WL that may be used to access the memory cell. Memory access line drivers may provide various voltages to the memory access lines during memory operations, for example, during program operations, read operations, erase operations, as well as other memory operations.

In some examples, an SGD switch may be configured to selectively couple a string to a signal line VBL and an SGS switch may be configured to selectively couple a string to a source line SRC. By way of example, an SGD switch of a string included in a memory subblock 102 may be coupled to a respective SGD control line 106 associated with the memory subblock 102. Providing (e.g., asserting) an active control signal on the SGD control line 106 may enable the respective SGD switch, thereby coupling the associated string to the signal line VBL. An SGD control line 106 providing an active control signal to enable the SGD switch in this manner is described herein as an "active" SGD control line 106. Similarly, SGS switches of each memory subblock 102 may be coupled to the SGS line 120. Providing an active control signal on the SGS line 120 may enable the SGS switches, thereby coupling each string to the source line SRC. The SGS control line 120 providing an active control signal to enable the SGS switch in this manner is described herein as an "active" SGS control line 120.

Providing an inactive control signal on the SGD control line 106 may disable the respective SGD switch, thereby decoupling the associated string from the signal line VBL. An SGD control line 106 providing an inactive control signal to disable the SGD switch in this manner is described herein as an "inactive" SGD control line 106. Similarly, an SGS switch of each memory subblock 102 may be decoupled from the SGS line 120. Providing an inactive control signal on the SGS line 120 may disable the SGS switches, thereby decoupling each string from the source line SRC. An SGS control line 120 providing an inactive control signal to disable the SGS switch in this manner is described herein as an "inactive" SGS control line 120.

In some examples, control signals provided on respective SGD control lines 106 and the SGS control line 120, respectively, may be provided by control unit 150. The control unit 150 may be coupled to each of the SGD control lines 106 and the SGS control line 120, and further may be configured to provide active and/or inactive control signals to perform respective memory operations. The control unit 150 may be implemented in software and/or hardware, and may include any circuitry and or logic required to perform operations. In some examples, the control unit 150 may be included in the block 100 and in other examples, the control unit 150 may be located outside of the block 100 and may, for instance, be distributed among one or more of a row decoder, an address decoder, control logic coupled to the block 100 and a controller (not shown in FIG. 1).

Generally, memory operations (e.g., read operations, program operations, erase operations) may be performed on one or more selected memory subblocks 102 while all other memory subblocks 102 may be unselected. Performing a memory operation on one or more selected memory subblocks 102 may include selectively enabling SGD switches, SGS switches, and/or memory cells. Description of memory operations is made herein with respect to individual memory subblocks 102. Moreover, reference is made herein to selectively enabling SGD and SGS switches to perform memory operations. As described, SGD and SGS switches may be enabled by providing control signals on SGD control lines 106 or the SGS control line 120, respectively. The control signals may be provided in this manner by the control unit 150. It will be appreciated that in some examples, described operations may be performed in multiple phases. A programming operation, for instance, may include sequentially programming portions of one or more subblocks 102, examples of which are described further below.

In an erase operation, for example, SGD and SGS switches may be disabled. A low voltage, such as a ground potential (e.g., 0V), may be applied to the memory access line 104 associated with a row during an erase operation. In some examples, erase operations may be implemented at a block level and accordingly one or more memory subblocks 102 may be erased simultaneously. As a result, all SGD lines 106 and the SGS line 120 may have a low voltage during an erase operation to disable the SGD and SGS switches.

In an example read operation, each signal line may be precharged to a voltage (e.g., 0.3V), and both the SGD and SGS switches of a memory subblock 102 may be enabled. Because the SGS control line 120 may be associated with one or more other memory subblocks 102, SGS switches of other memory subblocks 102 may be enabled as well. Thereafter, a relatively low voltage (e.g., 0-2V) may be applied to a memory access line 104 associated with the row to be read, while an access voltage (e.g., 8V) may be applied to all other memory access lines 104. In some examples, the relatively low voltage may be a voltage having a magnitude between voltage levels of particular voltage states. Further, as described, a magnitude of the access voltage may be greater than a voltage of the voltage state having a highest magnitude to ensure that all memory cells of the memory subblock 102 are conductive. The SGD switches may be disabled, and the voltage of each signal line may be used to determine the voltage state of each memory cell of the row.

Typically, program operations are performed on erased memory cells, and as a result, only memory cells of a memory subblock 102 intended to be adjusted from an erased voltage state to a different voltage state need be programmed. In an example programming operation, each row of a memory subblock 102 may be programmed sequentially. By way of example, for each memory access line 104, signal lines associated with a cell to be programmed may be precharged to a first precharge voltage (e.g., 0-1V) and signal lines associated with a cell not to be programmed may be precharged to a second precharge voltage e.g., 2-3V) that may for instance, be higher than the first precharge voltage. A relatively high voltage (e.g., 15V) may be applied to the memory access line 104, while an access voltage e.g., 8V) may be applied to all other memory access lines 104. A magnitude of the access voltage may be greater than a voltage of the voltage state having a highest magnitude to ensure that all memory cells of the memory subblock 102 are conductive. Thereafter, an SGD control line 106 associated with the selected memory subblock 102 may become active and SGD switches associated with strings to be programmed may be selectively enabled (while SGS switches may remain disabled) to program cells of the row. Because signal lines associated with cells not to be programmed have a higher precharge voltage, SGD switches associated with those signal lines may remain disabled and prevent programming of respective cells. In some examples, the relatively high voltage applied to the memory access line 104 may be incrementally increased until each cell of the target row achieves a desired voltage level. During the programming operation, SGD and SGS switches of unselected memory subblocks 102 may be disabled.

In embodiments employing multi-level cells, a program operation may include performing multiple programming passes as multi-level cells may need to programmed multiple times such that each cell is programmed to a distinct voltage level. By way of example, multi-level cells configured to store 3 data bits may each be programmed 3 times such that any of the 8 voltage levels required to represent the 3 data bits may be distinctly recognized during a read operation.

Figure 2:
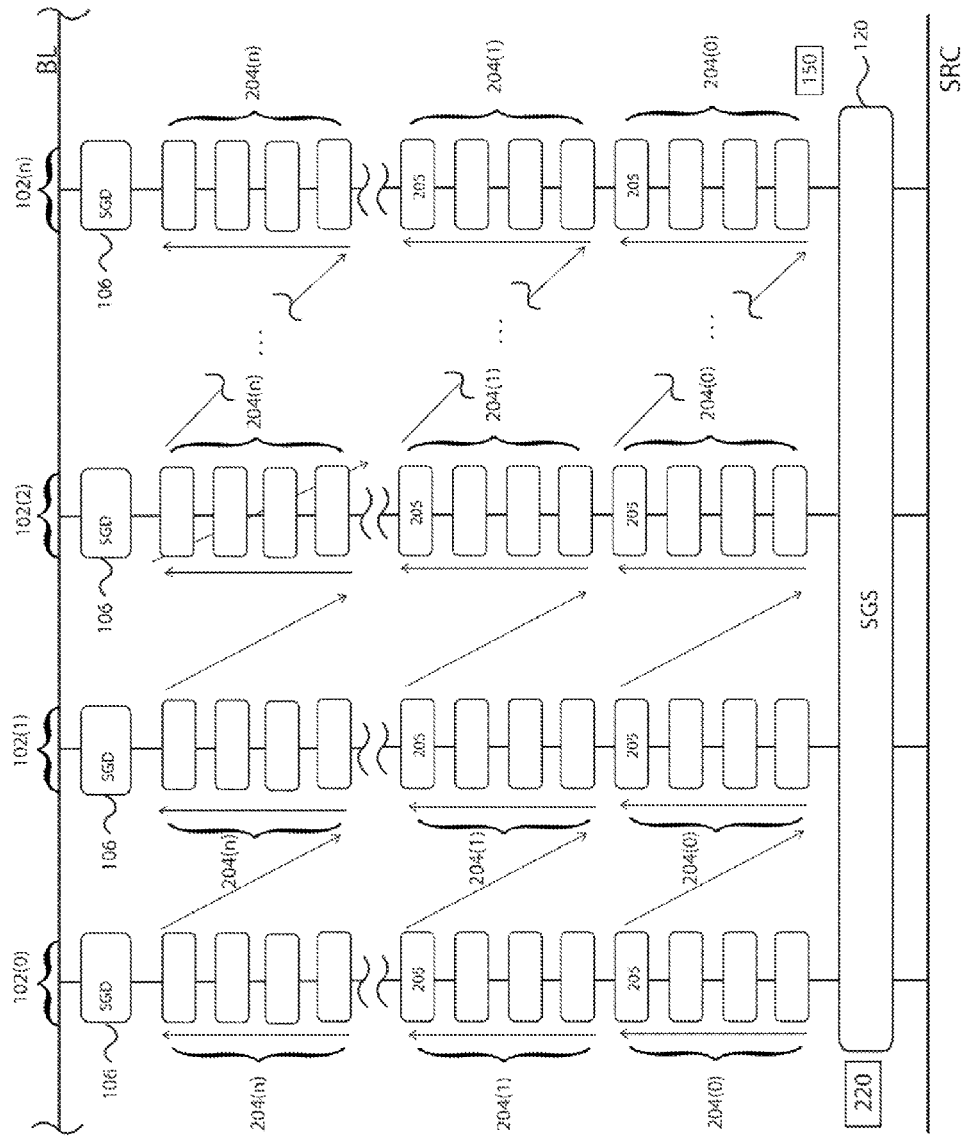
FIG. 2 is a block diagram of an apparatus according to an embodiment of the present invention.

FIG. 2 is a block diagram of an apparatus that includes a memory block 200 according to an embodiment of the present invention. The memory block 200 includes elements that have been previously described with respect to the memory block 100 of FIG. 1. Those elements have been shown in FIG. 2 using the same reference numbers used in FIG. 1 and operation of the common elements is as previously described. Consequently, a detailed description of the operation of these elements will not be repeated in the interest of brevity.

Each subblock 102 of the block 200 may include a plurality of access line groups 204. Each plurality of access line groups 204 may include a respective plurality of memory cells and may be coupled in a series configuration between an SGD switch and the SGS switch. In this manner, each access line group 204 may comprise a portion of a NAND string. As described, the SGD switch may be selectively enabled using a respective SGD control line 106 and each SGS switch may be selectively enabled using the SGS control line 120. Though each access line group 204 is illustrated as including four memory cells, it will be appreciated that each access line group 204 may include any number of memory cells. For example, an access line group may include two memory cells, eight memory cells, or 16 memory cells. One or more access line groups 204 may further include a boundary cell 205. As will be described in further detail below, operations may be performed on one or more access line groups 204 individually. In some embodiments, a boundary cell 205 of an access line group 204 may be programmed differently than other cells of the access line group 204.

The memory block 200 may further include a buffer 220 that may be configured to store data that may be used during a program operation. The buffer 220 may store data for programming one or more access line groups 204.

Figure 3:
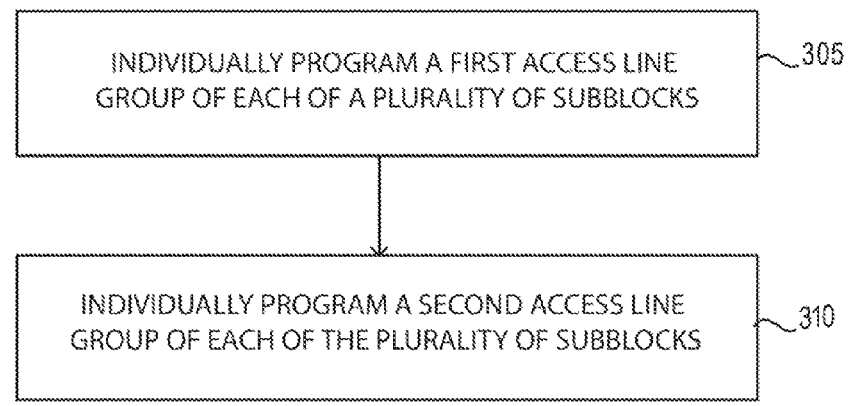
FIG. 3 is a flow diagram of a method for programming a block of memory according to an embodiment of the present invention.

FIG. 3 is a flowchart of a method 300 for programming a block of memory according to an embodiment of the present invention. The method 300 may be implemented using the block 200 of FIG. 2.

At a step 305, the control unit 150 may individually program a first access line group 204 of each subblock 102 of the block 200. That is, the control unit 150 may program an access line group 204 of a first subblock 102 and subsequently program an access line group 204 of a second subblock 102, and so on, until an access line group 204 of each subblock 102 has been programmed. The control unit 150 may program memory cells of the access line group 204 using one or more programming passes and using data stored in the buffer 220. In some examples, the control unit 150 may program a same respective access line group 204 in each subblock 102. For instance, the control unit 150 may program the access line group 204(0) of each subblock 102. In some examples, the control unit 150 may be configured to program each access line group 204 sequentially. By way of example, the control unit 150 may program the access hue group 204(0) starting with subblock 102(0), then program the access line group 204(0) of subblock 102(1), followed by programming the access line group 204(0) of subblock 102(2), and so on until the access line group 204(0) of subblock 102(n) is programmed. In other examples, the control unit 150 may program each access line group 204 in any other desired order.

Programming cells of an access line group 204 may include performing multiple programming passes such that each memory cell is programmed a particular number of times. Accordingly, in programming an access line group 204, the control unit 150 may program the access line group 204 using any number of programming passes. By way of example, the control unit 150 may use twelve programming passes to program the four memory cells of an access line group 204 of FIG. 2 three times. The first pass may be used to program the first memory cell a first time, the second pass may be used to program the second memory cell a first time, the third pass may be used to program the first memory cell a second time, the fourth pass may be used to program the third memory cell a first time, the fifth pass may be used to program the second memory cell a second time, the sixth pass may be used to program the first memory cell a third time, the seventh pass may be used to program the fourth memory cell a first time, eighth pass may be used to program the third memory cell a second time, the ninth pass may be used to program the second memory cell a third time, the tenth pass may be used to program the fourth memory cell a second time, the eleventh pass may be used to program the third memory cell a third time, and the twelfth pass may be used to program the fourth memory cell a third time. It will be appreciated that memory cells of access line groups 204 may additionally or alternatively be programmed in any other manner such that each memory cell is programmed a desired number of times.

At a step 310, the control unit 150 may individually program a second access line group 204 of each subblock 102 of the block 200. The control unit 150 may program a same respective access line group 204 in each subblock 102, and may, for instance, program access line groups 204 adjacent the access line groups 204 programmed at the step 305. By way of example, if the access line group 204(0) of each subblock 102 was programmed at the step 305, the control unit 150 may program the access line group 204(1) of each subblock 102 at the step 310. In some embodiments, the access line group 204(1) of subblock 102(0) is first programmed, followed by programming the access line group 204(1) of subblock 102(1), and then the access line group 204(1) of subblock 102(2), and so on to the access line group 204(1) of subblock 102(n). Access line groups 204 programmed at the step 310 may be programmed in a same manner as those programmed during the step 305, or may be programmed in a different manner. By way of example, each access line group 204 programmed at the step 310 may be programmed in a same order as the access line groups 204 programmed at the step 305 (e.g., first pass to program the first memory cell, the second pass to program the second memory cell, the third pass to program the first memory cell, the fourth pass to program the third memory cell, the fifth pass to program the second memory cell, the sixth pass to program the first memory cell, and so on).

Each subblock 102 may include any number of access line groups 204. Accordingly, while the method 300 is described with respect to individually programming first and second access line groups 204 of each subblock 102 (e.g., access line groups 204(0) and 204(1), respectively), it will be appreciated that the programming of the access line groups 204 may be repeated until all of the access line groups 204 of each subblock 102 are programmed during a program operation associated with the block 200. The control unit 150 may iteratively program an access line group 204 of each subblock 102 until all access line groups 204 have been programmed.

In this manner, the access line groups 204 of subblocks 102 may be programmed using one or more programming passes. By programming the access line groups 204 of subblocks 102 individually, the minimum number of data required to program memory cells using multiple programming passes may be relatively low compared to existing systems. Accordingly, capacity of buffers, such as the buffer 220, used to buffer program data for program operations may be reduced.

A boundary memory cell 20 may be affected by disturb effects (e.g., cell to cell interference) resulting from the programming of an access line group 204 adjacent the access line group 204 of the boundary memory cell 205. This may occur, for instance, when memory cells of an adjacent access line group 204 are programmed with multiple programming passes. Generally, each access line group 204 may include one boundary memory cell 205, though it will be appreciated that in examples employing other programming sequences, each access line group 204 may alternatively include 0 or two boundary memory cells 205. As a first example, with reference to access line groups 204(0), 204(1), and 204(2) of a subblock 102, if cells of access line groups 204(0) and 204(2) adjacent the access line group 204(1) are programmed after access line group 204(1), the memory cell 205 of the access line group 204(1) adjacent the access line group 204(0) and the memory cell 205 of the access line group 204(1) adjacent the access line group 204(2) may be boundary memory cells 205. As another example, if access line groups 204(0) and 204(2) are programmed prior to access line group 204(1), the access line group 204(1) may not include any boundary memory cells 205 as no cells adjacent the access line group 204(1) may have been programmed after the access line group 204(1) is programmed. In some examples, each access line group 204(n), or the final access line group 204 of each subblock 102 to be programmed during a program operation may not include a boundary memory cell 205 as each access line group 204(n) may be adjacent a respective SGD switch 106. As will be described, in some examples, boundary memory cells 205 of an access line group 204 may be programmed differently than other memory cells of the access line group 204. In this manner, errors resulting from program disturb effect may be mitigated.

Figure 4:
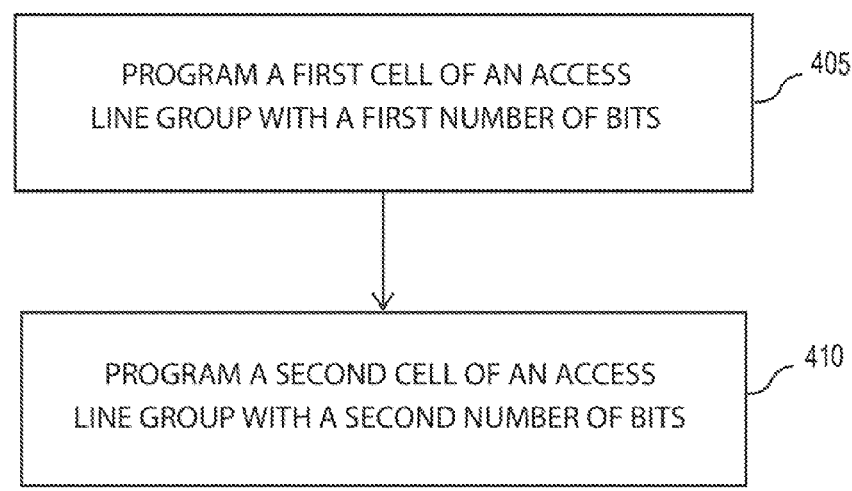
FIG. 4 is a flow diagram of a method for programming, an access line group according to an embodiment of the present invention.

FIG. 4 is a flowchart of a method 400 for programming an access line group according to an embodiment of the present invention. The method 400 may be used to implement one or more of the steps 305 and 310 of FIG. 3. At a step 405, the control unit 150 may program a first memory cell of an access line group 204 with a first number of bits of data. As described, each memory cell of an access line group 204 may include data including any number of bits (e.g., three bits).

At a step 410, the control unit 150 may program a second memory cell of the access line group 204 with a second number of bits of data. The number of bits may be greater or lesser than the number of bits programmed in the first memory cell at the step 410. As an example, the first memory cell programmed at the step 405 may be programmed with N bits of data and the second memory cell programmed at the step 410 may be programmed with N−1 bits of data. As another example, the first memory cell programmed at the step 405 may be programmed with N bits of data and the second memory cell programmed at the step 410 may be programmed with N−2 bits of data. The memory cell programmed with the second number of bits of data (e.g., N−1 bits of data) may, for instance, be a boundary memory cell 205 of the access line group 204.

Programming each of the first and second memory cells at the steps 405, 410, respectively, may be performed using any number of programming passes. For instance, the first and second memory cells may each be programmed using twelve programming passes. In some examples, the step 405 and the step 410 may be at least partially performed in an overlapping, concurrent, and/or simultaneous fashion. By way of example, the control unit 150 may use twelve programming passes to program four memory cells of an access line group 204 three times. The first pass may be used to program the first memory cell a first time, the second pass may be used to program the second memory cell a first time, the third pass may be used to program the first memory cell a second time, the fourth pass may be used to program the third memory cell a first time, the fifth pass may be used to program the second memory cell a second time, the sixth pass may be used to program the first memory cell a third time, the seventh pass may be used to program the fourth memory cell a first time, the eighth pass may be used to program the third memory cell a second time, the ninth pass may be used to program the second memory cell a third time, the tenth pass may be used to program the fourth memory cell a second time, the eleventh pass may be used to program the third memory cell a third time, and the twelfth pass may be used to program the fourth memory cell a third time. It will be appreciated that memory cells of access line groups 204 may additionally or alternatively be programmed in any other manner such that each memory cell is programmed a desired number of times. In some instances, the control unit 150 may omit the final programming pass as the fourth memory cell may require a fewer number of programming passes to achieve a desired number of bits (e.g., N−1).

Each access line group 204 may include any number of memory cells. Thus, while the method 400 has been described with respect to programming first and second memory cells of an access line group 204, in some examples, any number of memory cells of an access line group 204 may be programmed with any respective number of bits of data. By way of example, one memory cell may be programmed with N−1 bits of data and the remaining memory cells (e.g., three memory cells) of the access line, group 204 may be programmed with N bits of data.

By programming a memory cell of an access line group 204, such as a boundary memory cell 205, with a lower number of bits, voltage differential between each voltage state may be increased. In turn, increased voltage differentials may provide better immunity from interference caused by program disturb effects when programming the memory cells of adjacent access line groups.

Figure 5:
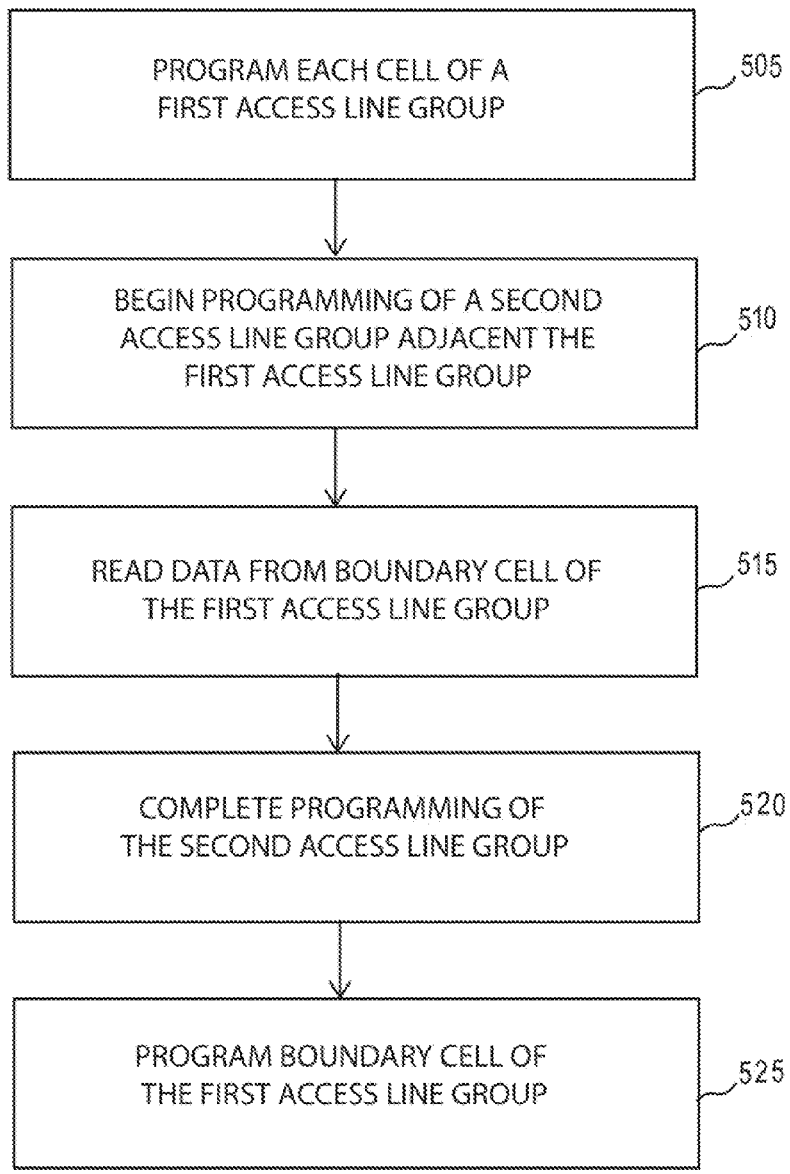
FIG. 5 is a flow diagram of a method for programming an access line group according to an embodiment of the present invention.

FIG. 5 is a flowchart of a method 500 for programming an access line group according to an embodiment of the present invention. The method 500 may be used to implement one or more of the steps 305 and/or 310 of FIG. 3. The method 500 may be implemented using the block 200 of FIG. 2. For clarity, the method 500 is described with respect to access line groups 204(0), 204(1) of a subblock 102, though it will be appreciated that the method 500 may be employed to program any other access line groups 204.

At a step 505, the control unit 150 may program each memory cell of the access line group 204(0) of a subblock 102. As described, memory cells of the access line group 204(0) may be programmed using multiple programming passes. Subsequently, at a step 510, the control unit 150 may begin to program access line group 204(1). With reference to FIG. 2, the access line group 204(1) may be adjacent a boundary memory cell 205 of the access line group 204(0). In particular, the control unit 150 may begin to program a memory cell of the access line group 204(1) adjacent the boundary memory cell 205 of the access line group 204(0). Beginning to program the memory cell in this manner may include precharging one or more signal lines, causing one or more memory cells to be conductive, enabling one or more SGD switches, and/or may include performing one or more programming passes on the memory cell.

At a step 515, the control unit 150 may read data from the boundary memory cell 205 of the access line group 204(0). Data read in this manner may be buffered, for instance, in the holler 720 or any other buffer. At a step 520, the control unit 150 may complete programming the memory cell of the access line group 204(1) adjacent the boundary memory cell 205 of the access line group 204(0). At a step 525, the control unit 150 may program the boundary memory cell 205 with the data read at the step 515.

In this manner, the boundary memory cell 205 may be programmed with a different number of programming passes than other memory cells of the access line group 204(0). The boundary memory cell 205 may, for instance, be programmed with four programming passes while other memory cells of the access line group 204(0) may be programmed with three programming passes. By programming the boundary memory cell 205 of the access line group 204(0) at the step 515, program disturb effect resulting from programming the adjacent memory cell of the access line group 204(1) may be mitigated. For example, by programming the boundary memory cell 205 an additional time after the adjacent memory cell of the access line group 204(1) has been programmed, any interference caused by the program disturb effect may be corrected.

Figure 6:
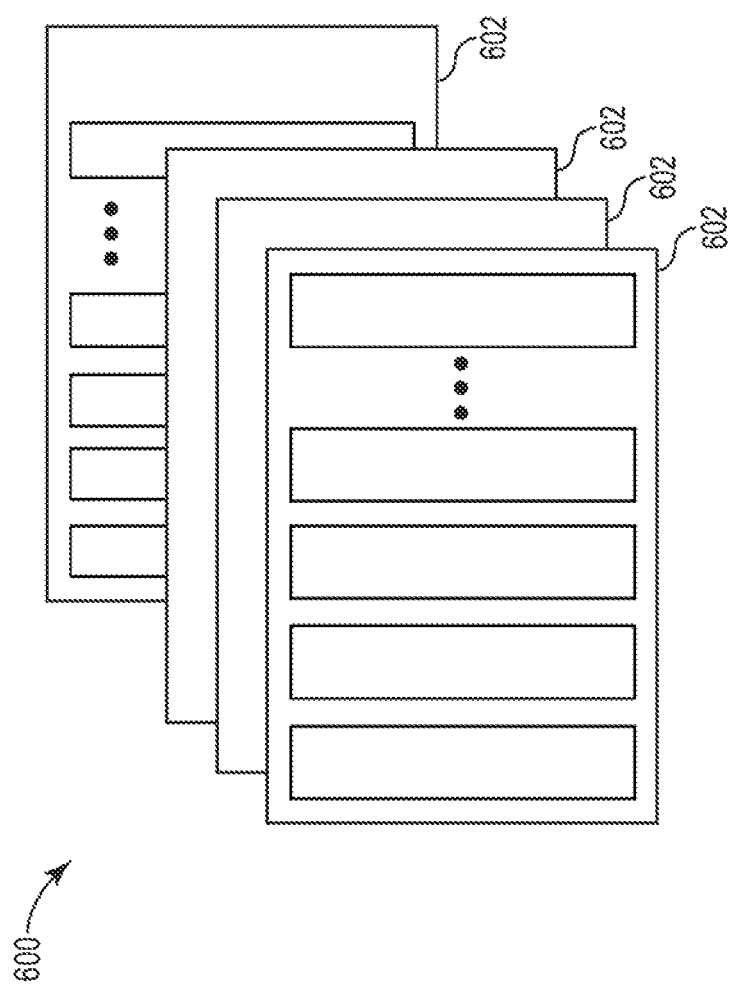
FIG. 6 is a block diagram of a three-dimensional memory array according to an embodiment of the present invention.

In some examples, the block 100 and/or the block 200 may be implemented in a three-dimensional arrangement. FIG. 6 is a block diagram of a three-dimensional memory array 600 according to an embodiment of the present invention. The three-dimensional memory array 600 may include any number of three-dimensional blocks 602, one or more of which may be implemented using the block 100 of FIG. 1 or the block 200 of FIG. 2. By way of example, the three-dimensional memory array 600 may include 32 blocks 602, or may include 64 blocks 602. In some examples, memory cells of each block 602 may be accessed concurrently, simultaneously, and/or in an otherwise overlapping manner such that data may be read from programmed to and/or erased from multiple blocks 602 in accordance with one or more memory operations. In other examples, the blocks 602 may be configured to share one or more components, such as signal lines and/or control lines.

Because the block 100 and/or the block 200 may be implemented three-dimensionally, in some examples one or more subblocks 102 may be implemented three-dimensionally as well. With reference to FIG. 2, for example, while subblocks 102 have been shown as including a single string, it will be appreciated that each subblock 102 may include any number of strings, each of which may be simultaneously programmed in accordance with examples described herein. As an example, programming an access line group 204, as described with respect to step 305 of FIG. 3, may include simultaneously programming one or more memory cells of each string of an access line group 204.

Figure 7:
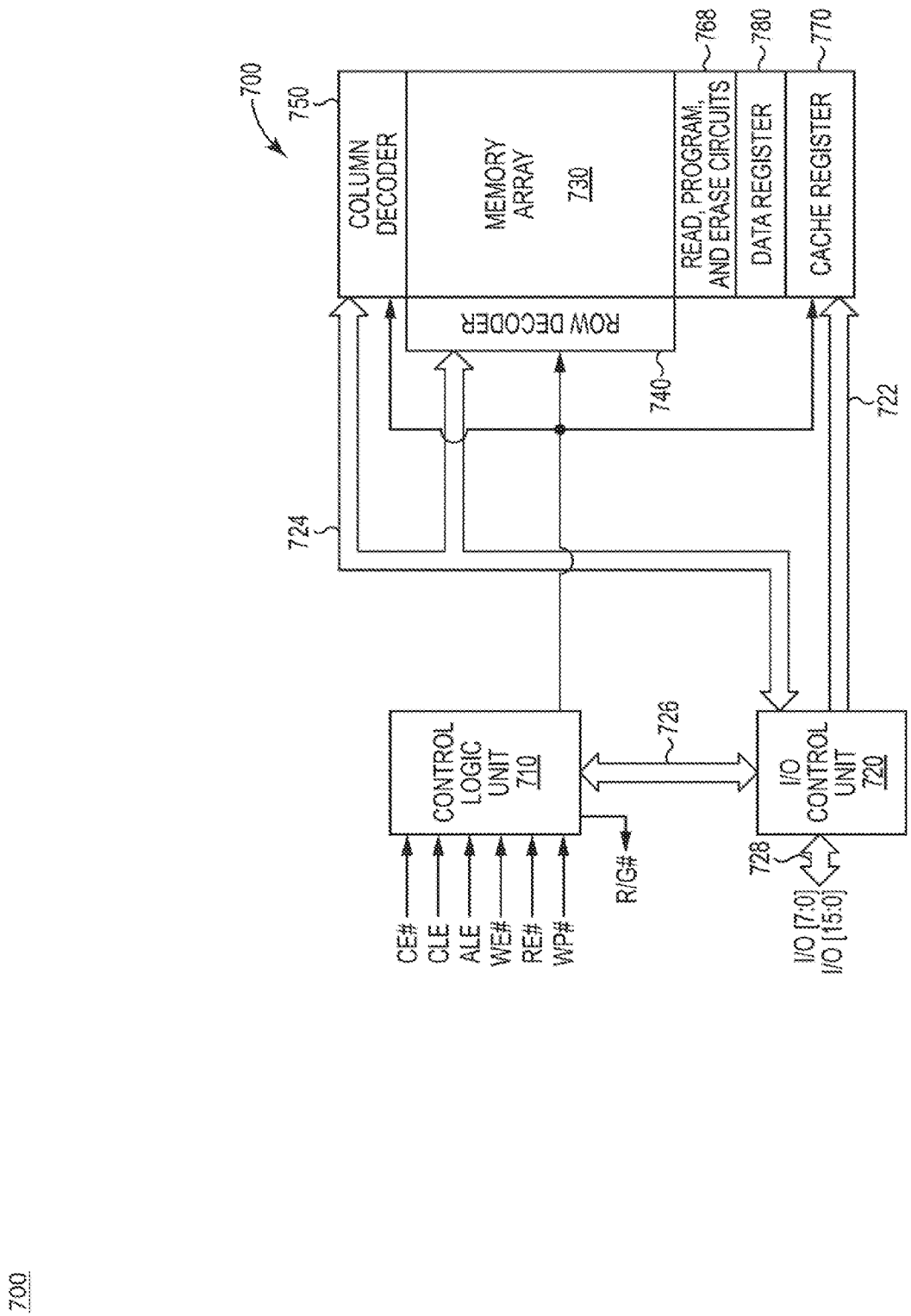
FIG. 7 is a block diagram of a memory according to an embodiment of the present invention.

FIG. 7 illustrates a memory 700 according to an embodiment of the present invention. The memory 700 includes a memory array 730 with a plurality of memory cells. The memory cells may be non-volatile memory cells, such as NAND flash cells, or may generally be any type of memory cells. In some examples, the memory array 730 may include one or more memory blocks, such as a memory block 100 of FIG. 1 and/or the memory block 200 of FIG. 2. Moreover, the memory array 730 may be implemented as a three-dimensional memory array, such as the three-dimensional memory array 600 of FIG. 6.

Command signals, address signals, and write data signals may be provided to the memory 700 as sets of sequential input/output ("I/O") signals transmitted through an I/O bus 728. Similarly, read data signals may be provided from the memory 700 through the I/O bus 728. The I/O bus 728 is connected to an I/O control unit 720 that routes the signals between the I/O bus 728 and an internal data bus 722, an internal address bus 724, and an internal command bus 726. The memory 700 also includes a control logic unit 710 that receives a number of control signals either externally or through the internal command bus 726 to control the operation of the memory 700.

The internal address bus 724 applies block-row and/or subblock-row address signals to a row decoder 740 and column address signals to a column decoder 750. The row decoder 740 and column decoder 750 may be used to select blocks of memory or memory cells for memory operations, for example, read, program, and erase operations. The column decoder 750 may enable write data signals to be applied to columns of memory corresponding to the column address signals and allow read data signals to be coupled from columns corresponding to the column address signals.

In response to the memory commands decoded by the control logic unit 710, the memory cells in the memory array 730 are read, programmed, and/or erased. Read, program, erase circuits 768 coupled to the memory array 730 receive control signals from the control logic unit 710 and include voltage generators (e.g., charge pumps) for generating various pumped voltages for read, program and erase operations. In some examples, the control logic unit 710 may include one or more control units described herein, such as the control unit 150 of FIG. 1.

After the row address signals have been applied to the internal address bus 724, the I/O control unit 720 routes write data signals to a cache register 770. The write data signals are stored in the cache register 770 in successive sets each having a size corresponding to the width of the I/O bus 728. The cache register 770 sequentially stores the sets of write data signals for an entire row or page of memory cells in the memory array 730. All of the stored write data signals are then used to program a row or page of memory cells in the memory array 730 selected by the block-row address or subblock-row address coupled through the internal address bus 724. In a similar manner, during a read operation, data signals from a row or block of memory cells selected by the block-row address coupled through the internal address bus 724 are stored in a data register 780. Sets of data signals corresponding in size to the width of the I/O bus 728 are then sequentially transferred through the I/O control unit 720 from the data register 780 to the I/O bus 728.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a memory block including a plurality of subblocks of memory cells, each of the plurality of subblocks of memory cells including a plurality of access line groups coupled in series in a string of memory cells;
a control unit configured to program a first access line group of each subblock of the plurality of subblocks during a program operation and to program a second access line group of each subblock of the plurality of subblocks that is coupled in series with the first access line group of the same subblock during the program operation responsive to completing the programming of the first access line group of each of the plurality of subblocks,
wherein the control unit is further configured to program a first memory cell of the first access line group of a subblock of the plurality of subblocks a first number of times and to program a second memory cell of the first access line group of the subblock of the plurality of subblocks a second number of times different than the first number, and
wherein the control unit is further configured to program the second memory cell the second number of times responsive to programming a third memory cell adjacent the second memory cell.

2. The apparatus of claim 1, wherein the control unit is further configured to program a first memory cell of the first access line group of a subblock of the plurality of subblocks with a first number of bits and to program a second memory cell of the first access line group of the subblock of the plurality of subblocks with a second number of bits different than the first number.

3. The apparatus of claim 2, wherein the control unit is further configured to program a third memory cell of the first access line group of the subblock of the plurality of sub blocks with the first number of bits, the first number of bits greater than the second number of bits.

4. The apparatus of claim 1, wherein the control unit is configured to program the first access line group of each of the plurality of subblocks multiple times.

5. The apparatus of claim 1, wherein the memory block is included in a three-dimensional memory array.

6. An apparatus, comprising:
a subblock comprising:
a first access line group including first and second memory cells;

a second access line group including a third memory cell adjacent the second memory cell; and a control unit configured to program each of the first and second memory cells a same number of times during a program operation and further configured to read data from the second memory cell responsive to the control unit beginning programming of the third memory cell during the program operation, the control unit further configured to program the second memory cell with the data read from the second memory cell responsive to the control unit completing programming of the third memory cell.

7. The apparatus of claim 6, wherein the control unit is further configured to store the data in a buffer.

8. The apparatus of claim 6, wherein the control unit is configured to read data from the second memory cell responsive to the control unit precharging one or more signal lines, to cause one or more memory cells to be conductive, to enable one or more SGD switches, to program the third memory cell one or more times, or a combination thereof.

9. The apparatus of claim 6, wherein the subblock and control unit are included in a memory.

10. A method, comprising:
   programming a first memory cell of a first access line group of each of a plurality of subblocks a first number of times, wherein each of the plurality of subblocks includes a plurality of access line groups coupled in series in a string of memory cells;
   programming a second memory cell of the first access line group of each of a plurality of subblocks a second number of times responsive to programming a third memory cell adjacent the second memory cell, wherein the second number of times is different than the first number of times; and
   after programming the first access group of each of the plurality of subblocks, programming a second access line group of each of the plurality of subblocks wherein the second access line group of each of the plurality of subblocks is coupled in series with the first access line group of the same subblock.

11. The method of claim 10, wherein programming the first access line group of each of the plurality of subblocks includes:
   individually programming the first access line group of each of the plurality of subblocks.

12. The method of claim 10, wherein programming a first access line group of each of the plurality of subblocks comprises:
   programming a first memory cell of the first access line group of each of the plurality of subblocks with a first number of bits; and
   programming a second memory cell of the first access line group of each of the plurality of subblocks with a second number of bits different than the first number of bits.

13. The method of claim 12, further comprising:
   programming a third memory cell of the first access line group of each of the plurality of subblocks with the first number of bits, the first number of bits greater than the second number of bits.

14. The method of claim 12, wherein programming a first memory cell of the first access line group of each of the plurality of subblocks with a first number of bits comprises:
   programming a first memory cell of the first access line group of each of the plurality of subblocks with N bits; and
   wherein programming a second memory cell of the first access line group of each of the plurality of subblocks with N−1 bits.

15. A method, comprising:
   programming, with a control unit, each of a plurality of memory cells of a first access line group a same number of times, the plurality of memory cells including a boundary memory cell;
   beginning programming of a memory cell of a second access line group, the memory cell of a second access line group adjacent the boundary memory cell;
   reading data from the boundary memory cell;
   completing the programming of the memory cell of the second access line group; and
   programming the boundary memory cell with the data read from the boundary memory cell responsive to completing the programming of the memory cell of the second access line group.

16. The method of claim 15, wherein beginning programming of a memory cell of a second access line group comprises precharging one or more signal lines, causing one or more memory cells to be conductive, enabling one or more SGD switches, programming the memory cell of a second access line group one or more times, or a combination thereof.

17. The method of claim 15, wherein programming the boundary memory cell with the data comprises:
   programming a boundary memory cell of each of a plurality of strings of the first access line group.

18. The method of claim 15, wherein reading data from the boundary memory cell comprises:
   storing the data in a buffer.

* * * * *